United States Patent [19]
Winsemius et al.

[11] Patent Number: 5,792,305
[45] Date of Patent: Aug. 11, 1998

[54] FIXTURE FOR DECAPSULATING PLASTIC ENCAPSULATED ELECTRONIC DEVICE PACKAGES

[75] Inventors: Martin L. Winsemius, Felton; Richard A. Kanishak, Danville, both of Calif.

[73] Assignee: Nisene Technology Group, Soquel, Calif.

[21] Appl. No.: 752,127

[22] Filed: Nov. 20, 1996

Related U.S. Application Data

[63] Continuation-in-part of Ser. No. 679,222, Jul. 12, 1996.
[51] Int. Cl.$^6$ .................................................. B44C 1/22
[52] U.S. Cl. ................................................ 156/345; 216/83
[58] Field of Search ......................... 156/345 L, 345 LS, 156/637.1, 639.1; 216/38, 56, 90, 92, 83

[56] References Cited

U.S. PATENT DOCUMENTS

| | | | |
|---|---|---|---|
| 4,826,556 | 5/1989 | Kobayashi | 216/92 X |
| 5,443,675 | 8/1995 | Wensink | 156/345 |

OTHER PUBLICATIONS

Model 250 Operation, Installation and Service Manual.

*Primary Examiner*—William Powell
*Attorney, Agent, or Firm*—Skjerven Morrill MacPherson Franklin & Friel; Thomas S. MacDonald

[57] ABSTRACT

Apparatus for selectively etching a resinous encapsulant wall forming an electronic device package includes etching solution source; an etching assembly including an etch head and orifice for directing etchant solution onto an exterior surface of the package; a cover extending over an etch plate mounting the etch head and forming an etching chamger; a frame on the etch plate and in the chamber for mounting the package such that a package exterior surface is mounted against the etch head, the frame including a sealing gasket between the frame and the etch head and surrounding the orifice; and a ram for pushing and sealing the frame against the etch head peripherally outwardly of and surounding the etch head orifice. In a second embodiment the frame is an etch cup having a well with or without apertures for receiving package leads. In one embodiment the frame mounts a ball grid array package, the frame including a handle perventing contact of heated solder balls. Another embodiment includes a universal positioner for locating one or more devices in a device package extending over the etch head orifice.

16 Claims, 8 Drawing Sheets

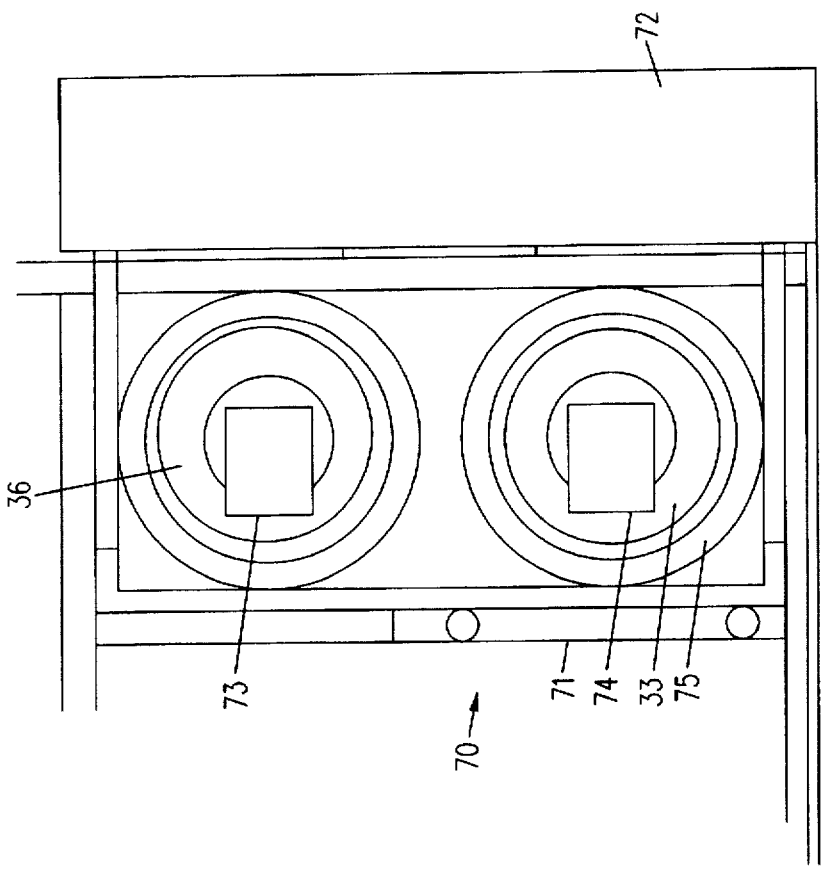
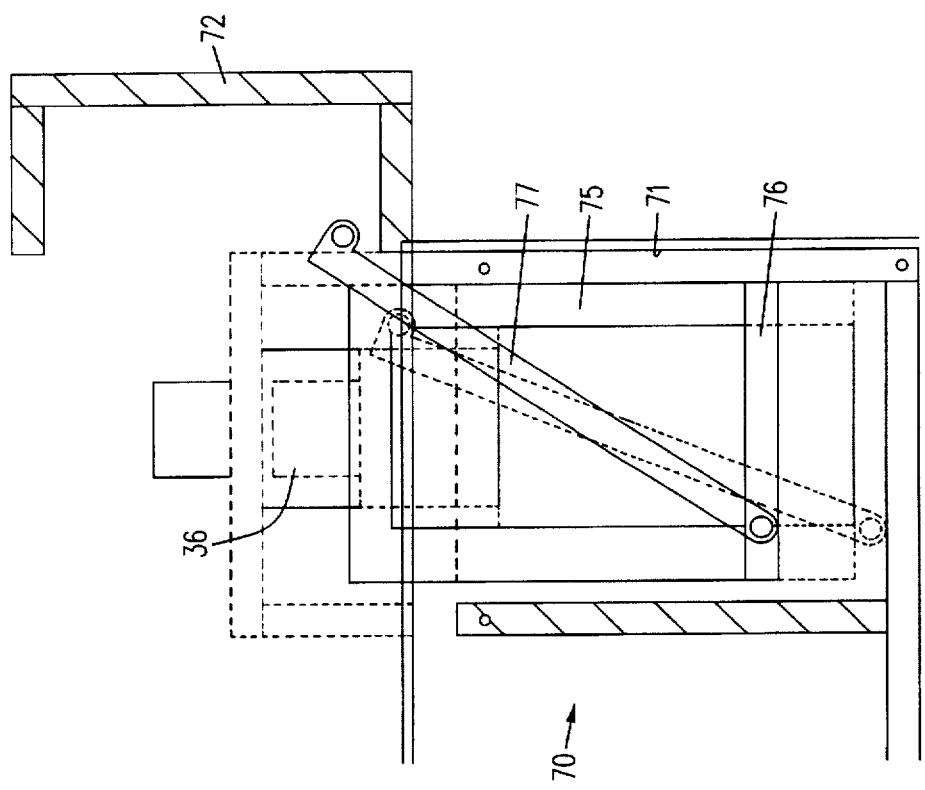

FIXTURE FOR DECAPSULATING PLASTIC ENCAPSULATED ELECTRONIC DEVICE PACKAGES

This application is a continuation-in-part of U.S. Ser. No. 08/679,222 filed Jul. 12, 1996 in the name of Richard A. Kanishak and Kirk A. Martin.

RELATED APPLICATION

This application relates to U.S. patent application Ser. No. 08/656,498 filed May 31, 1996, in the name of Kirk A. Martin and entitled Decapsulator and Method for Decapsulating Plastic Encapsulated Device; the disclosure of which is incorporated herein by reference.

FIELD OF THE INVENTION

The present invention relates to an apparatus more particularly to fixturing for holding and sealing the package and applying an etchant to a plastic encapsulated device package, to provide access to the device or chip for internal visual inspection, test and repair.

BACKGROUND OF THE INVENTION

Plastic packaging of various electronic devices including semiconductor chips have been employed for some years. Typical an epoxy resin is molded around the chip, a central portion of a lead frame and bonding wires or other connections between contact pads on the chip to inner lead fingers on the lead frame. It is often desirous to decapsulate the package at least in part to allow for inspection, test and repair of the chip and the wire bonds to the chip and inner lead fingers, after at least part of the epoxy covering these elements is safely and effectively removed.

Commonly, concentrated acids such as sulfuric and nitric acids or other solvents for the resin have been employed. Problems in prior art decapsulators and methods include difficulty in controlling the desired amount of etching, in removing debris formed in the etching process, prevention of damage to the package including interior metallization and providing for adequate safety.

An early patent in the decapsulator art is Wensink U.S. Pat. No. 4,344,809 where a jet etch apparatus includes an etching block and a jet pump provides for etchant flow.

A Decapsulator sold by B&G International, Inc. of Soquel, Calif., namely a Model 250, includes an appropriate acid resistant gasket seated on an etch head and the device to be decapsulated is placed on the gasket. A safety cover closes automatically when the process is started, clamping the device in place. The gasket on the etch head allows the chamber to be sealed and pressurized with nitrogen to approximately two PSI. The etching is started when a metering pump moves etchant from a heat exchanger located in plate with a sinuous passage into a cavity formed by the gasket, the device and the etch head. The acid remains in the chamber for a short period of time, where it reacts with or attacks the encapsulant material. After the etchant has been allowed to work, the pump is activated again and a fresh volume of acid is moved into the cavity. This process continues until the desired amount of device exposure is achieved. When the integrated circuit is exposed at the end of the etch cycle, the pump runs continuously to flush the cavity. After this rinsing period the entire system is purged with nitrogen, blowing all waste materials into a waste bottle. At the end of the process, the safety cover opens automatically and the device is removed for postetch cleaning.

U.S. Pat. No. 5,252,179 discloses a method and apparatus for selective spray etching of an epoxy encapsulated chip. A diaphragm can be raised or lowered to direct flow of etchant, and debris is removed without moving the chip from the chip carrier. Used etchant is collected and recycled. U.S. Pat. No. 5,127,991 shows a process for an etching copper sheets in which a pumped source of etchant is heated. U.S. Pat. No. 5,271,798 shows an etching process for tungsten residue on a semiconductor wafer including a sealed apparatus with an etchant inlet port and suction removal of etching byproduct.

In at least some of the prior art devices various deficiencies have been encountered. For example, a fixed etch head is provided which limits the area of the package which is to be etchant attacked; external auxiliary heaters must be used to heat the etchant; excessive etchant fume or seepage limit seal life; there is inefficient removal of etching debris; a particular slowness of the etching process is present due to non-reactive materials at the etch face; and there is a lack of keeping acid consumption low.

In the related application a first acid-resistant syringe pump operates as a positive displacement pump utilizing a standard syringe as the displacement cylinder and piston connected to a first flow valve. To eliminate any problems resulting from non-pulsing flow, a second acid-resistant syringe pump 40 is positioned upstream of the first valve and in connection to a flow line to introduce an oscillating flow of etchant solution. This second pump will, during the etching portion of the process, keep moving acid into and out of an etched cavity being continually formed on the package exterior which is exposed to the etchant, and which action eventually provides the desired decapsulation of the package.

Small outline transistors, commonly known as SOT's, typically have a length of about 2 mm, a width of about 1 mm and a thickness of about 0.5 mm. The epoxy encapsulation of an SOT typically will have a wall thickness of about 0.25 mm. Special problems have arisen with respect to decapsulating these very small electronic device SOT packages. If the etch process is terminated only on the basis of time of etch, the entire device can be digested with attendant damage to the small electronic device including bonding wires and metallization.

Prior art decapsulation etching has used negative pressure on the waste side of the etch head to transport acid to the device being etched. This process automatically terminates when an air leak is created by the side wall of the etched cavity etching through. The use of negative pressure creates a problem by causing the acid to release vapor in the etched cavity. The vapor prevents even etching and reduces the overall etch rate by reducing the efficacy of the acid. This process will leave acid in the lines between the acid control valves and the etch head because of the termination of all acid transport when an air leak is created. This also prevents rinsing the device being etched at the end of the etch process.

In die packages which are relatively thick such as packages containing a heat sink, which packages are about 6.0 mm in thickness it is known that the etching acids result in isotropic etching, that is, the etching proceeds divergingly from the outer surface being attacked by the acid. In contrast anisotropic etch will result in 90° sidewalls in the etched cavity. In isotropically etched packages the underside of the package which the acid is attacking, can be etched away so much, when approaching or reaching the required depth of etch to expose the die, that there is acid attack and breakthrough of the adjacent vertical sidewall(s) of the die. Thus a need has been found for avoiding an unwanted sidewall blowout in etching apparatus such as the Model 250 Decapsulator and other prior art devices.

In various medium and large size encapsulated devices such as square encapsulated dies of 14 mm to 40 mm square it is desirous of opening up multiple openings in the die encapsulant or to access particular dies in a multiple chip module. This has required in the past separate fixturing.

Problems have also arisen in attempting the decapsulation of very small chips having dimensions as 0.6 mm to about 1.5 mm per side or in diameter. These dimensions approximate the size of a printed dot "." in this specification.

In the decapsulation of ball grid array (BGA) packages using the described etching apparatus, a particular problem also has arisen to avoid a flowing of the exposed solder balls on the package at the etching temperatures (180° C. to 240° C.) which are present, and to avoid any contact of liquified non-flowing solder balls by any part of the etching apparatus and fixturing.

SUMMARY OF THE INVENTION

The present invention relates to an apparatus and method for decapsulation of a packaged electronic device, more particular a SOT or other small, medium or large package encapsulating one or more electronic semiconductor device, by using a positive pressure to transport the etchant to an etching cavity for removal *of elements of the epoxy resin from the etch face as well as fixturing for holding and sealing the package with respect to an etch head. The positive pressure effect provides an automatic cut-off of acid etchant flow and prevents any over-etching or interior destruction or damage of the package being decapsulated. The total cycle time is reduced while keeping acid consumption low. Reduced etchant heat time is also accomplished by providing an aluminum heat exchanger block, with a spiral-ended tube that acid flows through or, as in the related application an alumina ceramic, grooved cylinder heat exchanger or multiple holed alumina block in flow connection to the inlet port, and an aluminum heater block containing at least one resistance heater. Thus only a relative small volume of etchant need be heated immediately prior to the flow of the etchant against the package, lessening the overall decapsulating time.

The apparatus for selectively etching an encapsulant forming a package of resinous material around an electronic device includes a source of etchant solution; an etching assembly including an etch plate and an etch head having an etch head orifice for directing etchant solution onto an exterior surface of the package; a cover extending over at least a portion of the etch plate including the etch head orifice and forming an etching chamber; a frame in the form of an etch cup or other fixture customized for a particular IC package i.e., package specific, supported by the etch head such that the frame holds the package against the etch head; a sealing gasket between the frame and the etch head and surrounding the etch head orifice; and a ram for pushing and sealing the frame against the etch head peripherally outwardly and surrounding the etch head orifice. An electronic device package to be decapsulated is mounted in the chamber on the etch head in or on the fixture. A first pressurized conduit is provided for transporting a quantity of etchant solution from an etchant source (such as acid bottle) into the etch head onto an adjacent abutting surface of the encapsulant and then forming an etched cavity on an exterior surface of the electronic device package. Debris from the etching of the package is forced through a waste outlet extending from the etch head to a waste reservoir. Etching continues until there is a breakthrough in the encapsulant allowing the positive pressure in the bell jar to vent through the etched opening and to the waste outlet. This action simultaneously stops the pressurization of the acid bottle and hence the acid flow from the bottle. This action is not involved in those fixture embodiments where the packaged device is sealed within the fixture.

In another embodiment an apparatus for selectively etching an encapsulant forming a package around an electronic device includes an etch cup or fixture including a demountable cylindrical plug, O-ring sealed on the bottom of the etch cup, the cup having a central passageway extending through to the etch head, in flow connection to the source of etchant solution. The etch head assembly may include a spiral flow passage or spiral tubing for transferring heat from a resistance heater in the assembly to heat the flowing acid to a desired etching temperature. A waste passage or tube(s) extend from the etch cavity through the assembly to the waste bottle. The electronic device package is mounted in an etch cup or fixture or placed directly on a surface of the etch head facing the etching chamber.

In addition to the above, in one embodiment a first three-way valve and an acid bottle valve is opened to provide a positive pressure to a bell jar and an acid bottle, respectively. After etching a purging valve is employed to effectively rinse by flowing pressurization gas such as nitrogen through the purging valve into the bell jar chamber to clear any acid remaining on the device or in the acid lines. The first three-way valve, the acid flow valve and the purge valve are provided in a combined housing. Following completion of a cycle, another three-way valve is opened to vent the bell jar and through the opening of the acid bottle valve to vent the acid bottle.

The problems of the prior art of over etching causing damage to the electronic device can be reduced by using positive pressure to transport the acid and to pressurize the bell jar.

The etch cup fixture provides containment for etch cavities which extend beyond the sidewall being etched. The etch cup creates an artificial sidewall preventing acid flow and positive pressure of acid into the cover cavity. When the package includes leads extending from the package, the leads may be placed in a matching lead hole pattern in the etch cup fixture. Further, in one application the extending leads may be excised prior to mounting the package in the etch cup fixture since the leads are not necessary for the contemplated inspection/test of the die which has been encapsulated. Rubber or Teflon® blocks may be employed to fill any space between the package leads or package heat sunk extending from the package to support the leads or heat sink in the etch cup fixture. In another embodiment a seal plug and spring-actuated plunger is moved by the ram to move a Viton® or Teflon imperforate disk against a Viton or Teflon alignment disk having a central aperture mounting the package and in turn to seal and push the package against the etch head orifice.

In another embodiment useful when a ball grid array (BGA) package is to be decapsulated a frame fixture is provided in the form of an alignment plate pocketed for ball clearance assuring that the ram nose or parts of the fixturing will not contact the balls which have been heated to a melt non-flowing condition i.e., liquify the spheres by the heated etchant. The heated solder balls are cooled and solidify during the subsequent post-etch cleaning process of the decapsulated package.

In still another embodiment the frame fixture is a universal frame where package-holding members are movable in both X-axis and Y-axis direction to locate a desired spacial position on the top of a die package with respect to the etch head orifice. Thus the package can be etched at any desire spacial position or a particular die in a multi-die package can be exposed to the etch head and for etching away a sidewall at the location of that particular die.

BRIEF DESCRIPTION OF DRAWINGS

FIG. 5 is a side view partially in section of a containment housing for the acid and waste bottles.

FIG. 6 is a top view thereof with the cover also in the open condition.

DETAILED DESCRIPTION

Figure 1:
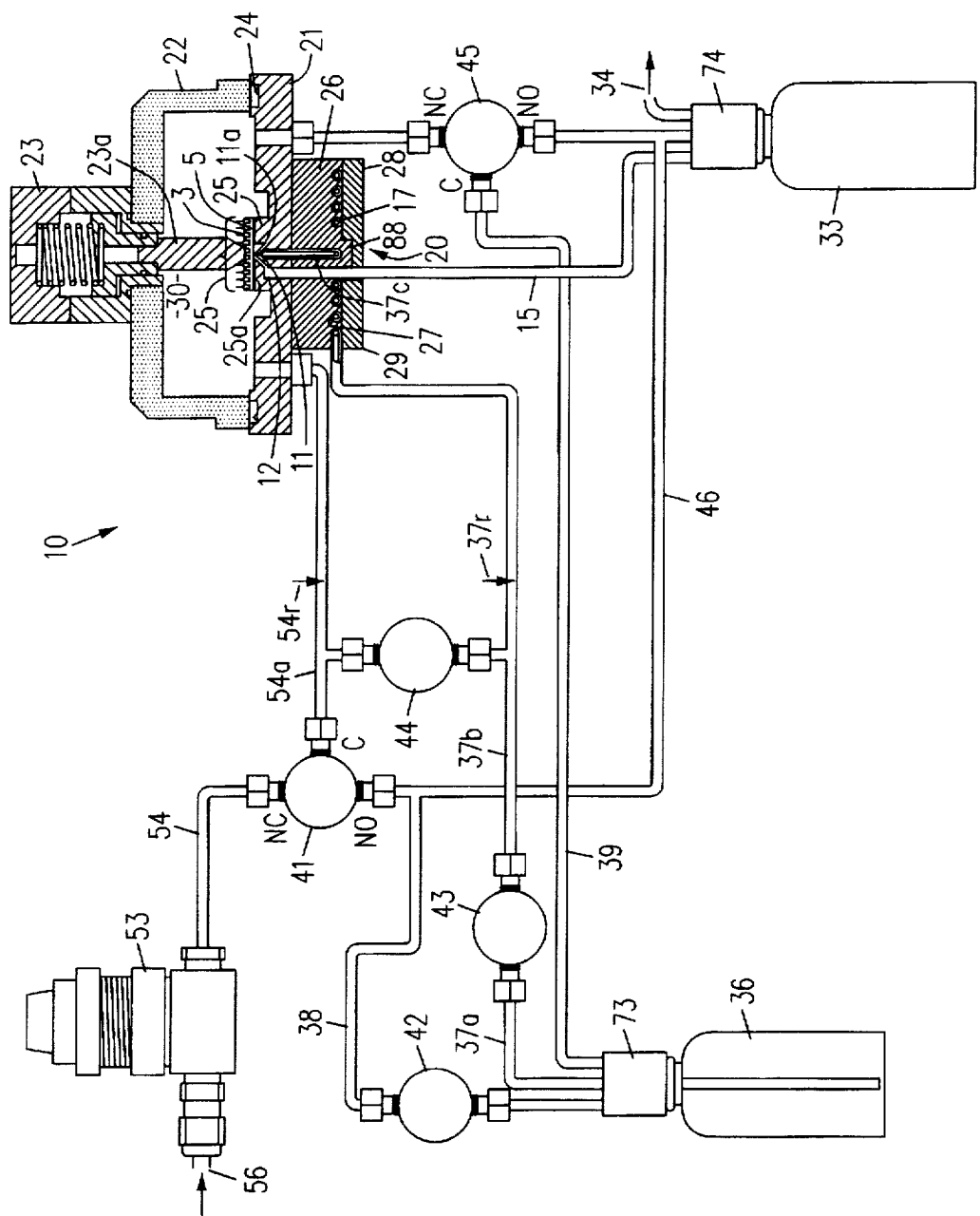
FIG. 1 is a schematic side view partially in section of the overall decapsulation apparatus.
Figure 8:
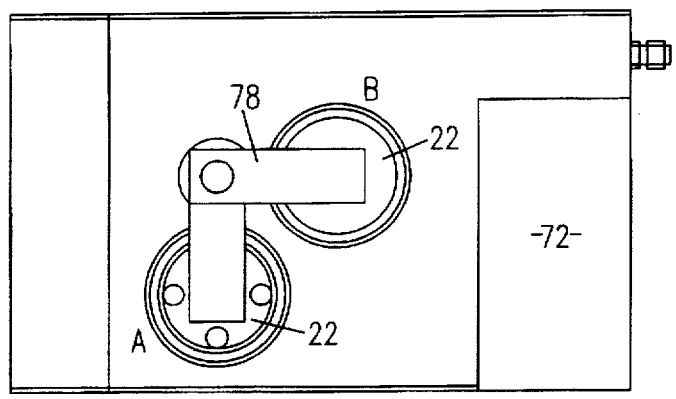
FIG. 8 is a top view thereof.

FIG. 1 shows a decapsulating system 10 including an etch head assembly 20 including an etch plate 21, an integral etch head 25 centrally of the plate, and a movable cover or bell jar 22 capable of being lifted and pivoted by structure (FIGS. 7 and 8) onto the etch plate 21. The interior of the bell jar forms an etching chamber 30. A spring pressed holder 23 with a ram nose 23a holds the SOT electronic device package 3 to be decapsulated against the etch cup or fixture or against an etch head top surface 25a and is sealed thereto by a gasket or seal 5. The etch head 25 includes an etchant solution inlet passage 11 and waste outlet passages 12 leading to a waste tube 15 extending through a bore in a heat exchanger block 26. Block 26 abuts the bottom of the etch head 25 and includes a spiral passageway 27 on its underside for receiving spirally-formed tubing 17 for heating etchant solution flowing through the tubing passageway. A heater block 28, including one or more resistance heaters 29, abuts against the bottom spiral tubing 17 and the heat exchanger block 26.

When no process is running, valve 41 is off, shutting off the low pressure to the entire unit. Valve 42 is open venting the acid bottle 36 and valve 45, is off, also venting the acid bottle. When an etch process is started, valves 41, 42 and 45 are activated allowing the bell jar and the acid bottle to pressurize to about 2 PSI. When valve 43 opens, the $N_2$ pressure through line 54 forces the acid from the bottle 36 through line 37a, through open valve 43, through line 37b, through a venturi flow restrictor 37 that controls acid flow volume, through the heat exchanger or other reservoir and through inlet passage 11 to impinge on the device to be etched. Acid will continue to flow as long as the device is sealed to the etch head.

As soon as a verticle side wall, i.e. a wall not including the surface being etched, of the package by formation of the etched cavity is etched through, i.e. a break-out occurs, the pressure inside the bell jar vents through outlet passage(s) 12 to the waste line 15 and to waste bottle 33 or other reservoir. This also increases the pressure in the acid lines 11, 37c, 17, 37b and 37a and reduces the pressure in the acid bottle. This increased pressure, when it reaches restrictor 37 essential blocks acid flow to the etch head. This prevents any further flow of acid. At the end of the etch process, valve 43 is allowed to close and valve 44 is opened. This pressurizes the acid carrying tubes 17 in the heat exchanger to greater than the pressure at the etch head and purges the heat exchanger of acid. This purge also rinses any remaining etch debris from the device being etched or in passage 12 and line 15 to waste bottle 33. Also, the valve 45 is positionable to connect the acid bottle 36 through line 39 to waste bottle 33 with valve 43 closed to vent the acid bottle 36.

The pressurization of the acid bottle 36 can only happen when the bell jar 22 is down on the etch plate and sealed thereon by seal 24. This prevents any possibility of acid transport when the etch head is exposed. The acid bottle is vented through both valve 42 and 45, requiring both valves to fail in the active state for pressure to remain in the acid bottle. The bell jar itself with a venturi flow restrictor 54 in line 54a, operates as a pressure relief valve. The closing pressure on the bell jar is limited to about 45 pounds. If the pressure inside the bell jar exceeds about 3 PSI, the bell jar will lift slightly venting the excess pressure across seal 24. As the pressure to the acid bottle is supplied from the bell jar, this limits the maximum pressure in the acid bottle 36. Additionally, both the source and waste bottles are fully enclosed each in its own secondary containment chamber, as seen in FIGS. 5 and 6.

An etchant solution, such as nitric acid, in particular fuming nitric acid, is utilized as an etching agent.

A standard low pressure regulator 53 such as Part No. 101-3008-1, available from Monnier Co. of Algonec, Mich. supplies the nitrogen gas for acid flow and for purging. About 40 psi of nitrogen gas is supplied (not shown) to operate the pneumatic controls (not shown) for the various valves. Valves 41, 42, 43, 44 and 45 may be Teflon® diaphragm pneumatically actuated valves as shown in FIG. 2.

To effectively transport etch debris and create a clean cavity, a flow rate of about 3 to about 5 ml per minute of acid is required. This is supplied by adjustment of the nitrogen pressure so that the inert gas pressure is between about 1.5 psi to about 3 psi. The acid and waste bottles typically are constructed of Teflon molded plastic or glass.

The etching procedure, in general, comprises 1) opening valves 41 and 45 and closing valve 42 to pressurize both the interior of the bell jar 23 and the acid bottle 36; 2) valve 43 is intermittently activated (opened) to pulse the acid flow to reduce acid consumption and to allow acid flow to the encapsulated package 3; 3) etching continues until break-out of the encapsulant; 4) when break-out occurs the bell jar pressure and the acid bottle pressure vent through the break-out to the waste lines, automatically stopping the acid flow and further etching; 5) valve 43 is then closed and valve 44 is opened clearing the acid lines by $N_2$ pressure while momentarily opening valve 43 to purge all the acid back to bottle 36; and 6) at the end of the cycle, valve 45 is closed and valve 42 is opened to vent the acid bottle. Valve 41 is closed to shut off the $N_2$ flow and vent the bell jar. Tubing line 46 extends between valve 41 and the waste bottle 33 to vent from the acid bottle through open valve 42 and line 38, and to vent the bell jar.

Figure 2:
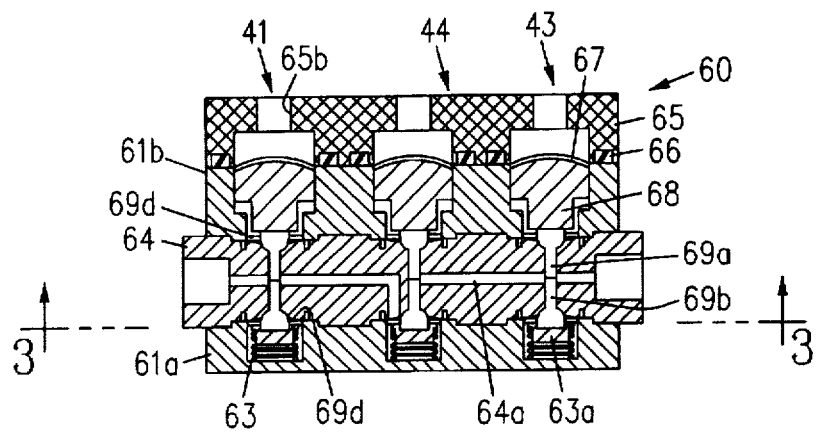
FIG. 2 is a cross-sectional side view of the combined valves and housing.
Figure 3:
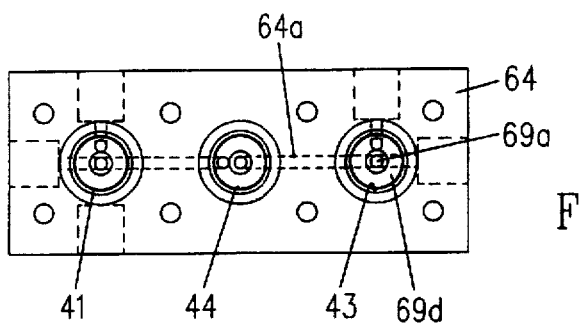
FIG. 3 is a bottom view taken on line 3—3 of FIG. 2 and top view of the valve block thereof.
Figure 4:
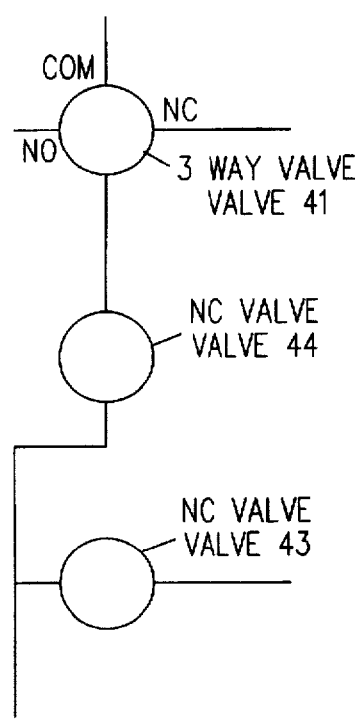
FIG. 4 is a schematic sketch of the interconnections of the valves in the combined housing.

FIG. 2 and 3 illustrate a single combined housing 60 for valves 41, 44, and 43. First rectangular housing member 61a includes three spring valve closure members 63 including a spring guide 63a. A rectangular valve block 64 contains the valve seats and flow passages. A second rectangular housing member 61b seats on valve block 64. A rectangular valve cover 65 is sealed by gaskets 66 to housing member 61b. Each valve includes an activation diaphragm 67 which moves an actuator 68 and diaphragm stem 69a into abutment with a diaphragm stem 69b attached to a diaphragm 69d which is spring pressed inwardly by spring guide 63a and spring 63. Air pressure enters the chamber, housing diaphragm 67, through aperture 65b. A push-pull operation of the diaphragm stems permits pressure flow through central passage 64a from valves 41, 44 and 43, the full diameter of the items blocking $N_2$ flow and the tapered ends of the stems permitting $N_2$ flow. FIG. 4 shows the various positions of three-way valve 41 namely NO standing for Normal Open, COM standing for Common, and NC standing for Normal Closed.

FIGS. 5 and 6 illustrate a protective housing 70 for the acid and waste bottles including a rectangular housing 71, a hinged cover 72 and an acid bottle manifold 73 and waste bottle manifold 74, such that when the cover 72 is closed the cover acts as a safety cover for each of the acid and waste bottles. A secondary containment is provided by a PVC pipe 75 surrounding each of the bottles and glued to a movable liftable plate 76 connected by arm 77 to cover 72. Upon opening the cover, plate 76 rises moving the bottles upward for ease of access. The dashed lines show the cover closed and the plate 76, pipe 79 and bottles "down" in the housing 70.

Figure 7:
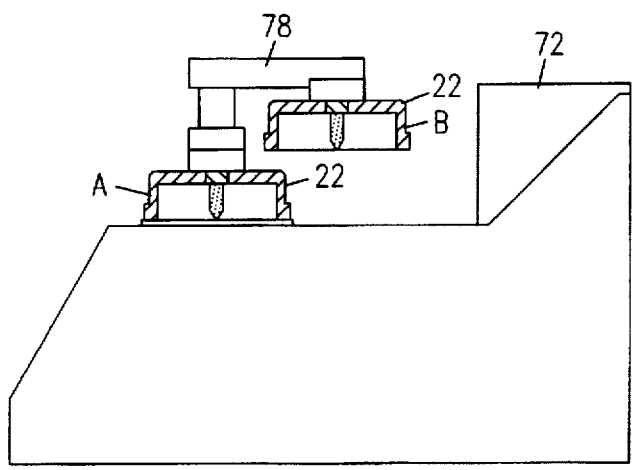
FIG. 7 is a side view partially in section of the overall device showing the bell jar mounting procedure.

FIG. 7 illustrates another embodiment of the acid bottle cover where cover 77 covers the acid bottle and a robotic actuator 78 moves the bell jar 22 from an etch position A to a raised, offset position B for placement of and removal of the encapsulated and decapsulated electronic device.

Figure 9:
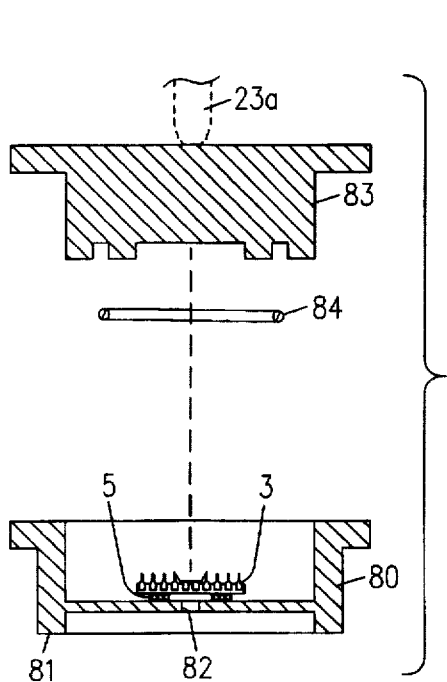
FIG. 9 is a cross sectional view of an etch cup and plug embodiment.

FIG. 9 illustrates one form of a cylindrical PTFE Teflon etch cup 80 having a bottom surface 81 which seats on the etch head 25 (FIG. 1). A circular aperture 82 allows access of acid to a device 3 to be decapsulated, mounted in the cup. The device 3 is sealed by annular seal 5 as in FIG. 1. A cylindrical Teflon plug 83 is press-fitted into the cup with an O-ring seal 84. The ram nose 23a presses down on the top of plug 83.

Figure 10:
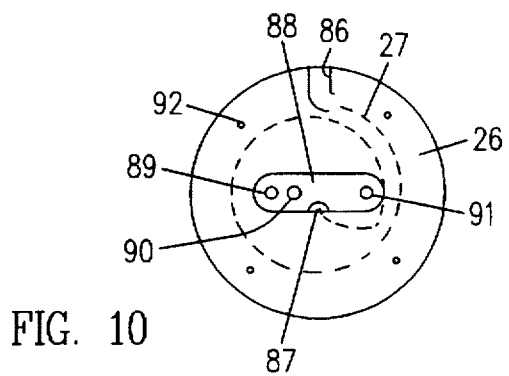
FIG. 10 is a bottom view of the heat exchanger block.
Figure 11:
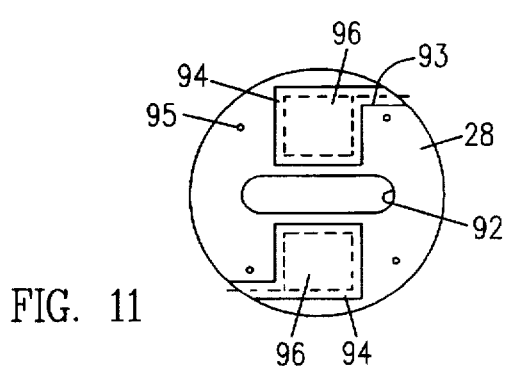
FIG. 11 is a top view of the heater block showing the surface interfacing with the surface shown in FIG. 10.

FIGS. 10 and 11 illustrate the interface between heat exchanger block 26 and heater block 28. The underside of heat exchanger block 26 in FIG. 10 includes a milled spiral groove 27 (dashed lines) which extends from a peripheral edge entry 86 to a milled entry port 87 of an oval integral Teflon® extension 88, depending from block 26 (FIG. 1). Tubing 17 extends along the grooves 27. The extension includes a pressurizing hole 89, a waste outlet hole 90 and a vent hole 91, and bolt holes 92 for assembly with the heater block 28. Facing the extension 88 is the aluminum heater block 28 which includes an oval slot 92 for press-fitted reception of the extension 88. Milled slots 93 are provided for a connector part of the resistance heaters, and are provided on opposite sides of the slot 92. The slots 93 lead to a rectangular milled areas 94 of about 0.25 mm deep, into which rectangular flat "pancake" resistance heaters 96 are placed. Bolt holes 95 match bolt holes 92 in block 26 and are aligned when extension 88 is placed in the slot 92.

In the decapsulation process using the above described apparatus, the etch may be a timed etch, for example, for 30 seconds but, if for any reason such as a thinner package wall or excess etching attack, the integrity of a package wall is broken prior to the 30 seconds, the 2 psi pressure in the bell jar will vent to the waste lines 12, 15 above seal 5 (FIGS. 1 and 9) stopping all flow from the acid bottle. Seal 5 only seals the IC package surface which faces the etch head or the bottom of the etch cup, if such a fixture is being used.

A small local processor (not shown), such an a PIC 16C55 processor available from Microchip Technologies of Chandler, Ariz., as is known in the art is used to control the valve functions. The control electronics are distributed between the multi-controller and the processor in the etcher unit. The multi-controller provides the user interface and the supervisory control of the etcher unit. A temperature control sub-processor (not shown) measures the output of the resistance heater, ambient temperature, line voltage, and current into the heaters. It adjusts the current into heaters based on the difference between the desired temperature of the heat exchanger and the actual temperature thereby controlling the heat exchanger temperature. A multi-controller (not shown) is used to send commands to the local processors and the local processor performs the actual valve and temperature control.

Etchant selection, safety equipment for the operator, unit set-up details of a typically used controller modified for use with the valve system of the invention, and general mechanical and electrical operations of a typical decapsulator are in the Model 250 Operation, Installation and Service Manual, the content of which are incorporated herein by reference.

All components, other than springs, screws, and selected valve components, are made of Teflon® plastic, glass, polypropylene, or PVC or other acid-resistant material. The only metal components utilized are the springs and screws which, where possible, are made of stainless steel. All five valves are pneumatically activated when decapsulation is being performed as described above. All manifold ports are the standard ¼-28 thread.

Figure 12:
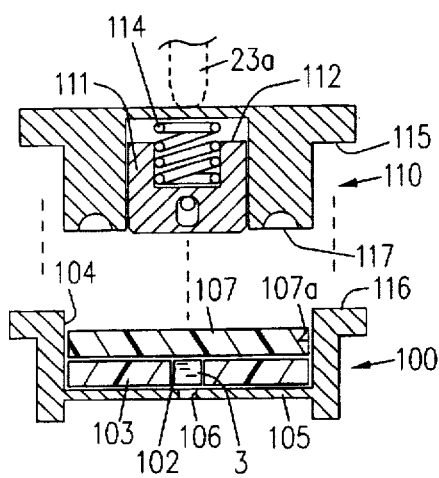
FIG. 12 is an exploded cross-sectional view of another embodiment of the etch cup and plug fixture.
Figure 12A:
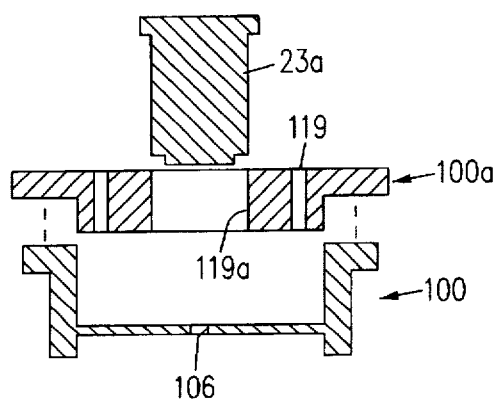
FIG. 12A is an exploded cross-sectional view of a vented etch cup.

FIG. 12 illustrates a varient of the etch cup fixture seen in FIG. 9. An electronic device package 3 in mounted within a circular etch cup 100, particularly in a central aperture 102 of a Viton® or Teflon® circular alignment gasket 103 placed against a bottom etch cup wall 105 in a first cavity 104 of the etch cup. The bottom etch cup wall 105 is apertured at 106 to receive acid flow from the etch head orifice 27 (FIG. 1). A circular blank (unapertured) Viton or Teflon disk 107, notched at 107a on its periphery for easy removal by a tweezer or pry implement, covers alignment gasket 103. Plug 110 slides into the cavity 104. Plug 110 includes a plunger 111 having an upper end 112 which is pressed by spring 114 and ram 23a against disk 107 and in turn against alignment gasket 103 to seal cavity 102. A flange stop 115 acting against flange 116 of the etch cup 100 prevents any overforce on the disk gasket and the package 3 in cavity 102, while effectively sealing the die package 3 except at the aperture 106 through which the etchant flows. An O-ring may be placed in groove 117. The etch cup 100, plunger 110 and other elements may be of various sizes, shapes and thicknesses to accommodate various sized device packages. FIG. 12A shows a vented etch cup assembly including etch cup 100 and a modified plug 100a and where apertures 119 and the absence of blank 107 allows for venting of the positive pressure in the bell jar 22 (FIG. 1) to stop acid flow when a chip sidewall is breached. A ram 23a is pushed down through aperture 119a to hold the chip against the top edges of acid aperture 106.

Figure 13:
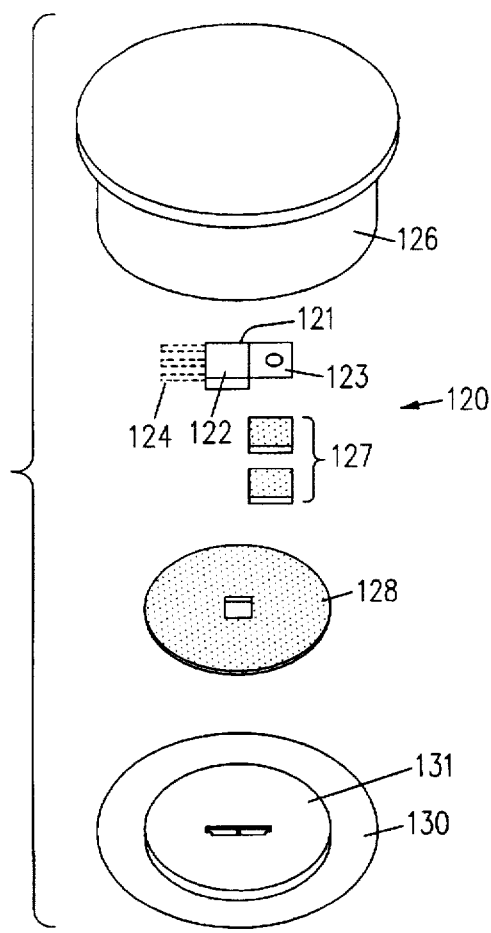
FIG. 13 is an exploded perspective view of an etch cup fixture for a transistor package.
Figure 14:
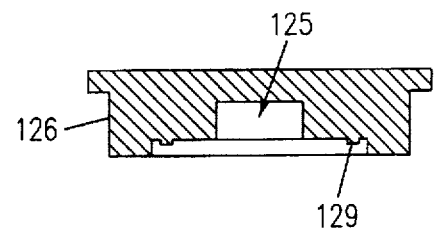
FIG. 14 is a cross-sectional view of the plug portion.
Figure 15:
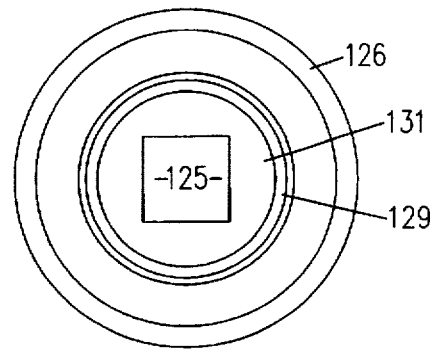
FIG. 15 is a bottom view of the plug portion.

FIG. 13–15 illustrate an etch cup kit 120 for decapsulating a transistor package 121 while providing containment for extended cavities beyond the package side walls. The transistor package 121 normally includes a die section 122, a heat sink 123, and leads 124 extending therefrom. The device package is placed in well 125 (FIG. 14) of the etch cup 126 after leads 124 have been excised. Rubber or Teflon blocks 127 may be positioned, after the package has been placed in well 125, to fill the space between the package heat sink and the etch head 131 in the etch plate 130. A definition gasket 128 may be used to reduce the initial etch cavity size produced by the etching action. In this embodiment, the etch cup 120 further includes an integral depending ring 129 for sealing against the etch head 131. The well 125 acts as a Teflon box creating an artificial side wall preventing the etchant from exiting into the interior of hood cover 22 (FIG. 1).

Figure 19:
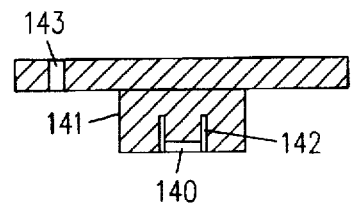
FIG. 19 is a cross-sectional view of the plug portion of an etch cup fixture for an extended leads package decapsulation.
Figure 20:
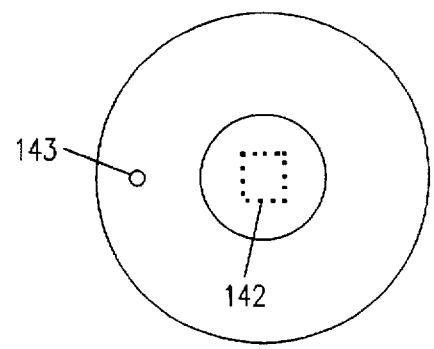
FIG. 20 is a bottom view thereof.
Figure 21:
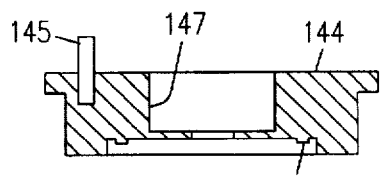
FIG. 21 is a cross-sectional view of the etch cup portion of the fixture.

FIGS. 19 and 20 show a fixture to decapsulate a dual-in-line package (DIP) or other array of leads extending from a side or edge of the package opposite to the package side wall to be etched. The well 140 in the etch cup cap 141 is provided with apertures 142 matching the lead pattern of the package to be decapsulated. The etch cup surface mating with the definition gasket may be lightly coated with high vacuum grease available from Dow Corning Chemical Co. of Midland, Mich. Device leads may be similarly coated to reduce acid damage. A location pin 145 (FIG. 21) is employed to accurately align hole(s) 143 in the cap 141 (FIG. 19) with the etch cup 144. As in the earlier embodiment, plug number 141 containing the device package is slid into cavity 147 of cup 144 and an integral depending ring 146 seals the cup to the etch head definition gasket. The cup 144 fits snugly over the etch head outer diameter.

Figure 16:
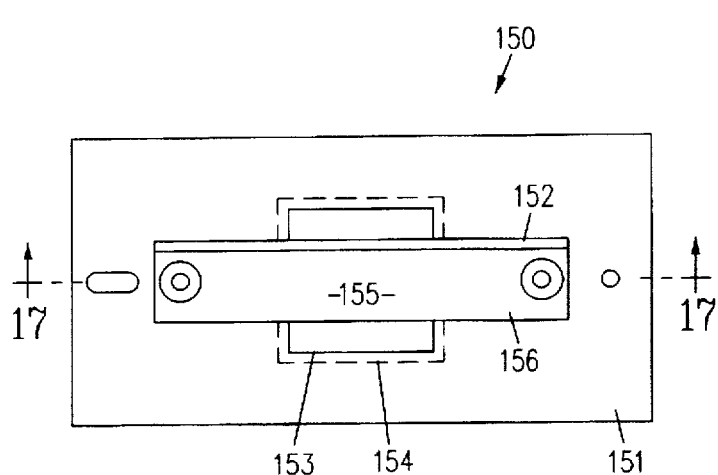
FIG. 16 is a top view of a ball grid array package fixture.
Figure 17:
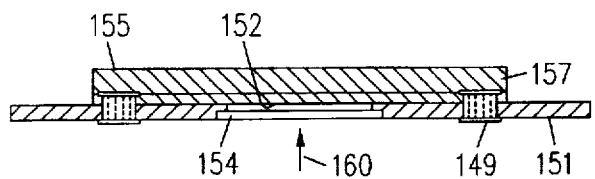
FIG. 17 is a cross-sectional view thereof taken on the line 17—17 of FIG. 16.
Figure 18:
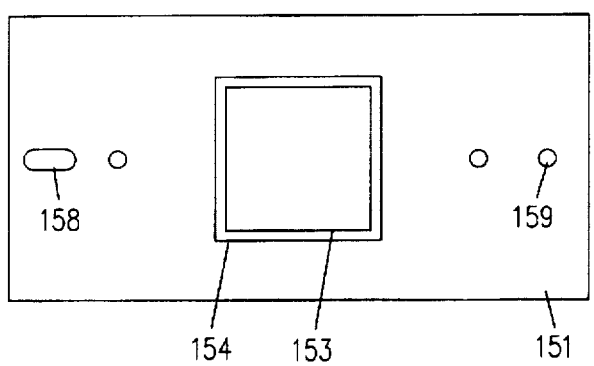
FIG. 18 is a bottom view thereof.
Figure 22:
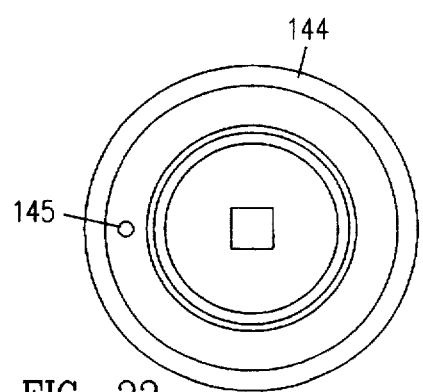
FIG. 22 is a top plan view thereof.
Figure 23:
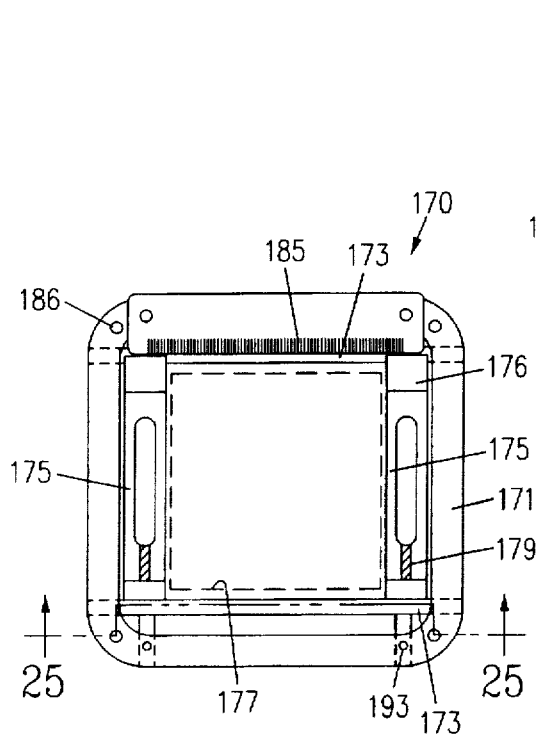
FIG. 23 is a top view of a universal positioner fixture showing an x-axis slider.

FIGS. 16–18 show a fixture for a plastic ball grid array (PBGA) package (illustrated as package 136 in FIG. 28) which has package contact pads on the surface of the package opposite the package side wall to be decapsulated by etching, in the form of solder balls. A fixture 150 includes an alignment plate or frame 151 specially pocketed for solder ball clearance. The rim or peripheral edge of the PBGA matches an internal rim 153 of the frame 151. The PBGA is placed into the pocket 154 from the underside of the frame (arrow 160). The balls face upward directly under the plane of the frame top surface and spaced vertically under a 90° angle bar 155 spanning the frame pocket and connected to the frame by fasteners 149. The PBGA may be held in the pocket preventing drop out by a ¼" (0.64 cm) strip of Kapton® tape (not shown) on opposite sides of the PBGA adjacent to the PBGA underside wall to be decapsulated by etching. A ram 23a, as in FIG. 1, presses against the horizontal portion 156 of angle bar 155 which with the alignment plate distributes the compressive force around the PBGA edges and seals the frame with the cavity definition gasket provided on the etch head as in the other embodiments. The vertical portion 157 of the angle bar serves as a handle for removal of the fixture from the etch head, using tweezers or the like. After etching has decapsulated the PBGA, it is preferred to leave the device in the frame until after post-etch solvent cleaning. The back (top) of the package containing the balls is completely protected and the decapsulated device package is in an opened condition on the underside of the fixture so that the device can be tested and inspected. Alignment apertures 158 and 159 are provided which with pins (not shown) on the etch plate, properly align fixture 150 with respect to the etch head.

FIGS. 23–26 and 30–31 illustrate a universal positioning fixture 170 including a frame 171 which is capable of accurately locating medium (about 14 mm maximum length) to large (about 40–63 mm maximum length) sized devices to relieve the ongoing demand for custom fixturing. This fixture is expressly designed for multiple chip modules in PBGA, QFP (quad flat pack), TQFP (thin QFP), DIP, SIP and PLCC (plastic leaded chip carrier) packages. These multiple-die packages require flexible fixturing and off-center alignment capabilities. Operator setups are simple and slides provided can float with adjustable friction or be locked down for repeated usage. Components are made of corrosion-resistant materials such as Teflon and stainless steel. Fixturing is easily disassembled for routine cleaning. The embodiment disclosed provides for a device dimension plus offset outlines up to 63 mm (2.50 inch) square; PBGA, QFP, TQFP, DIP, SIP (single inline plastic) and PLCC packages are easily accommodated; accuracy and repeatability of 0.2 mm (0.008 inch) is possible; and a 0.1 cm graduated scale is supplied for user reference and adjustment.

Figure 26:
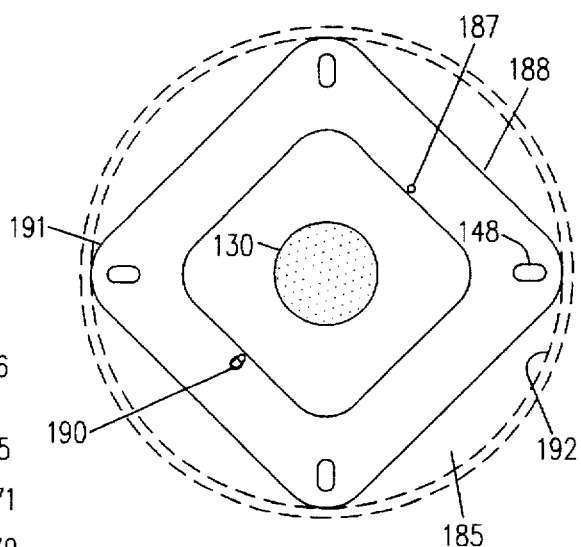
FIG. 26 is a top plan view showing a positioner template oriented to an etch head orifice.

As seen in FIG. 26 a sheet metal such as a stainless steel sheet metal template rectangle 188 is placed flush on the etch plate adjacent to etch head 130, locating the positioner on center to the etch head. Pins 187 extend from the etch plate 189 through apertures 190, one aperture being oval and the other circular. The edges 191 of the template abut a rim 192 on the etch plate 185, the rim also forming a side wall of a gasket groove surrounding the rim. The template is left on the etch head and the fixture is mounted thereon.

The frame 171 supports two pairs of parallel guide shafts 172 and 173 and two pairs of parallel sliders 174 and 175 on the shafts for x and y axis of travel. Each slider can be positioned independently, allowing either centered or offset device package alignment. The sliders glide on Teflon guide pieces or ends 176 at each corner of each of the x-axis and y-axis corners of the sliders where they engage and slide on the guide shafts. Each slider also has an adjustable plunger or set screw 178 and 179 used to tension or lock the slider when the desired position is reached. Screws 193 passing through the frame (FIG. 30) prevents the rods from bowing or moving outwardly. The frame 171 is specially located on the etch head by screws 186 fitting into holes adjacent to the etch head. The x and y sliders are moved outward leaving a "drop-in" space for a device package of various exterior dimensions.

Figure 27:
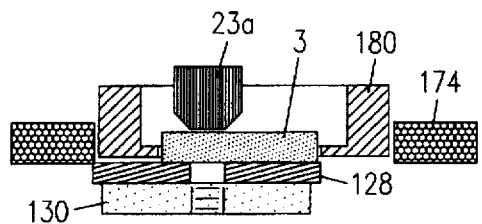
FIG. 27 is a schematic cross-sectional view of the x-axis slider with mounted etch cup, a package to be decapsulated, gasket, etch head and pressure ram.
Figure 25:
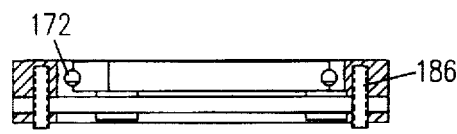
FIG. 25 is a cross-sectional view taken on the line 25—25 of FIG. 23 show a vertical adjustment mechanism.
Figure 28:
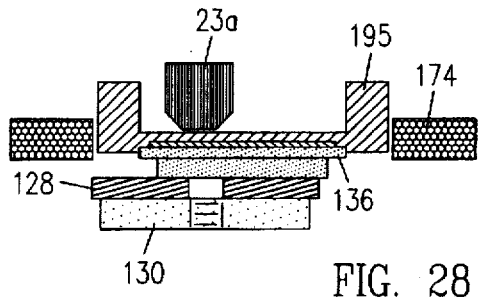
FIG. 28 is a schematic cross-sectional view of the x-axis slider for a ball grid array package, showing protection of the solder balls from ram pressure.
Figure 24:
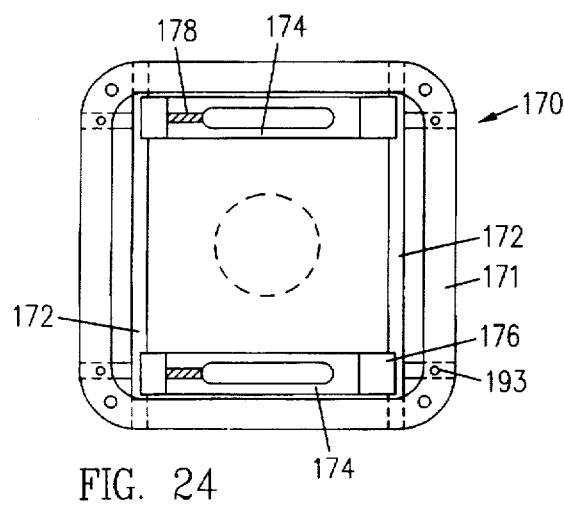
FIG. 24 is a top view thereof showing the stacked y-axis slider.
Figure 29:
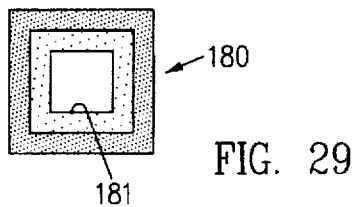
FIG. 29 is a top plan view of the device adaptor ring.
Figure 30:
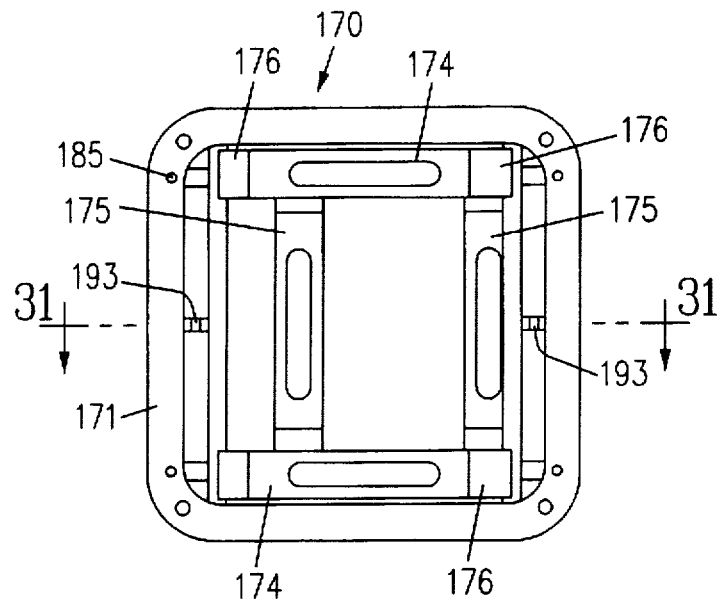
FIG. 30 is a bottom view of the positioner showing both the x-axis slider and a y-axis slider.
Figure 31:
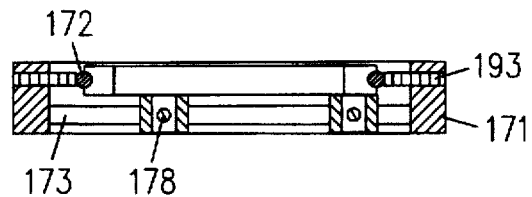
FIG. 31 is a sectional view taken on the line 3131 of FIG. 30.

As seen in FIG. 27 most package types will employ an alignment adapter 180 with the appropriate size opening 181 on center (FIG. 29) into which the device 3 (FIG. 27) is inserted. The adapter is preferably constructed of aluminum material and functions to facilitate the location of the device package. A large device package such as a long DIP, may be better aligned without an adapter. The adapter (or device) edges are located by the positioner sliders. The etch ram nose 23a as seen in FIGS. 27 and 28 apply sealing pressure to the device package either directly in FIG. 27 or by the adaptor 195 for the decapsulation of a PBGA 136 in FIG. 28. A PBGA requires a closed back alignment adaptor 195 (FIG. 28) to distribute the sealing force around the package edges via the pocketed device alignment adapter.

Engraved scales 185 (one shown in FIG. 23) with indicia lines and numbers thereon are provided to indicate the axial position of each slider from center. The fixture is inverted to access to the lower y-axis slider pair. The removable scale plates are placed in position temporarily to establish desired locations. Settings should be recorded for future reference. Sliders may be tensioned or locked into position to resist accidental movement by set screws 179. The fixture is flipped back over to set up the upper (x-axis) slider pair in the same way. The positioner assembly is placed on the etch plate by engaging elevator screws 186 into template location slots 148. The vertical position of the fixture is adjusted with the four elevator screws 186 as required.

After the appropriate cavity definition gasket 128 is selected and installed, the device adaptor and device package is placed into the region inside the fixture sliders. Proper fit is provided allowing small clearances between sliders and the adapter ring sides so that vertical travel is not obstructed. The available positioning area is designated by the dash line rectangle 177 in FIG. 23.

The above description of the preferred embodiments of this invention is intended to be illustrative and not limiting. Other embodiments of this invention will be obvious to those skilled in the art in view of the above disclosure.

We claim:

1. An apparatus for selectively etching a portion of an encapsulant forming a package of resinous material around an electronic device comprising:
   a source of etching solution;
   an etching assembly including an etch plate and an etch head having an etch head orifice for directing etchant solution onto an exterior surface of the package;
   a cover extending over at least a portion of the etch plate including the etch head orifice and forming an etching chamber;
   a frame positioned on said etch plate and in said chamber, said frame mounting the package such that an exterior surface of the package is mounted against said etch head, said frame including a sealing gasket between the frame and the etch head and surrounding the etch head orifice; and
   a ram for pushing and sealing said frame against said etch head peripherally outwardly of and surrounding the etch head orifice.

2. The apparatus of claim 1 wherein said frame is an etch cup, said cup including a cavity for insertion of the package into an open end of the cup in flow connection to said etch head orifice and the exterior surface of the package facing said etch head orifice, said cup having sidewalls which prevent etchant solution from reaching said etching chamber.

3. The apparatus of claim 2 in which said etch cup includes a package well in an interior surface of the etch cup, said well being sized to receive the package.

4. The apparatus of claim 3 further including spaced apertures in said well for receiving package leads extending from the package.

5. The apparatus of claim 3 wherein said etch cup open end includes an aperture definition disk for directing etchant solution from the etch head orifice to the exterior surface of the package.

6. The apparatus of claim 3 wherein the package includes an exposed heat sink extending laterally from the package, said well being sized to receive the package.

7. The apparatus of claim 6 further including support blocks filling a space between the heat sink and the etch head.

8. The apparatus of claim 3 wherein said etch cup comprises a planar top surface, said ram contacting said planar top surface.

9. The apparatus of claim 2 further including an etch cup plug movable into said cavity and forming said planar top surface.

10. The apparatus of claim 9 wherein said plug includes a spring plunger for sealing said cavity.

11. The apparatus of claim 9 wherein said plug includes a venting aperture for venting a positive pressure in the etching chamber when a package side wall is breached by the etchant solution.

12. The apparatus of claim 1 wherein said frame comprises a central opening having a bottom peripheral ridge and where a plastic ball grid array package is mountable on said ridge from an underside of the frame and solder balls on the package extend below a top plane of said frame.

13. The apparatus of claim 12 further including an angle bar extending across the frame central opening connected to a top surface of the frame.

14. The apparatus of claim 1 wherein said frame includes a first pair of parallel slider shafts extending across said frame; a second pair of parallel slider shafts extending across said frame at right angles from said first pair of parallel shafts; a first pair of sliders slidable on said first pair of parallel shafts; a second pair of sliders slidable on said second pair of parallel shafts; and wherein a device package is mountable between said pairs of sliders and said sliders are movable on said shafts to specially locate the device package on a position exposed to the etch head orifice.

15. The apparatus of claim 1 further comprising a template for specially locating said frame with respect to said etch head orifice, said template extending between an underside of said frame and the etch plate and etch head.

16. The apparatus of claim 15 further including an adapter inside said frame and above the sealing gasket.

* * * * *